United States Patent
Suh

(10) Patent No.: US 7,263,023 B2
(45) Date of Patent: Aug. 28, 2007

(54) SEMICONDUCTOR MEMORY DEVICE HAVING MEMORY ARCHITECTURE SUPPORTING HYPER-THREADING OPERATION IN HOST SYSTEM

(75) Inventor: Young-Ho Suh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 190 days.

(21) Appl. No.: 11/119,687

(22) Filed: May 3, 2005

(65) Prior Publication Data
US 2005/0249021 A1    Nov. 10, 2005

(30) Foreign Application Priority Data
May 4, 2004   (KR) ............... 10-2004-0031360

(51) Int. Cl.
*G11C 8/00*   (2006.01)
(52) U.S. Cl. ............... 365/230.06; 365/230.03
(58) Field of Classification Search ........... 365/230.06, 365/230.03, 233
See application file for complete search history.

(56) References Cited

U.S. PATENT DOCUMENTS

| | | | |
|---|---|---|---|
| 5,359,571 | A | 10/1994 | Yu |
| 5,473,573 | A | 12/1995 | Rao |
| 6,044,032 | A * | 3/2000 | Li ............... 365/230.03 |
| 6,154,418 | A * | 11/2000 | Li ............... 365/233 |
| 6,329,839 | B1 | 12/2001 | Pani et al. |
| 6,839,257 | B2 * | 1/2005 | Narita et al. ........ 365/49 |
| 7,099,226 | B2 * | 8/2006 | Yuan et al. ..... 365/230.03 |
| 2002/0057621 | A1 | 5/2002 | Heile |

* cited by examiner

*Primary Examiner*—Anh Phung
(74) *Attorney, Agent, or Firm*—Volentine & Whitt, PLLC

(57) ABSTRACT

A semiconductor memory device and a method of operating the semiconductor memory device are disclosed. The semiconductor memory device comprises a memory cell array having a plurality of cell array blocks. The cell array blocks are operationally divided into a plurality of memory planes using a memory determining unit. Each of the memory planes comprises at least one cell array block and is capable of executing independent data access operations using an independent operating mode.

31 Claims, 10 Drawing Sheets

SEMICONDUCTOR MEMORY DEVICE HAVING MEMORY ARCHITECTURE SUPPORTING HYPER-THREADING OPERATION IN HOST SYSTEM

BACKGROUND OF THE INVENTION

1. Field of the Invention

The present invention relates generally to a semiconductor memory device, and more particularly, to a high-speed semiconductor memory device such as Random Access Memory (RAM).

A claim of priority is made to Korean Patent Application 10-2004-0031360 filed on May 4, 2004, the disclosure of which is hereby incorporated by reference in its entirety.

2. Description of the Related Art

Semiconductor memory devices such as RAM typically function to store data in electronic systems. For example, a static random access memory (SRAM) is often used to store data transmitted or received between a host system such as central processing unit (CPU) or a digital signal processor (DSP) having a master function, and various peripheral devices having a slave function. SRAM is also used to store data for the host system in order to increase its overall processing speed. In such cases, the SRAM is used as a buffer memory or cache memory. Dynamic random access memory (DRAM), on the other hand, is typically used to temporarily store various operating system (OS) programs or to store data transmitted or received between a host system and a SRAM or between a data storage device such as a hard disk and a SRAM. Thus, DRAM is generally used as main memory.

In many cases, multiple processor modules are mounted in a host system and RAM modules are used to optimize data processing methods in order to meet various performance requirements for the host system. Unfortunately, however, practical difficulties arise when trying to mount individual RAM modules to each processor module in a portable electronic application system such as a cellular phone, a notebook computer, or a personal digital assistant (PDA). Thus, portable electronic application systems tend to employ only a single RAM module or a small number of RAM modules as physical space within the host device allows. As a result, the RAM modules used in these systems are typically not optimized for the processor modules in the system.

Recently, multimedia environments have been developed for portable electronic systems, thereby increasing the need for rapid data transmission by and large memory capacities within these systems. For example, where large amounts of multimedia information are processed and large amounts of corresponding data is transmitted/received, host systems often have a so-called dual-core architecture composed of a CPU and a DSP. Within the dual-core architecture, the CPU is typically used for general-purpose data processing, and the DSP is used to process multimedia information such as video, audio, etc. Accordingly, RAM modules are often designed to have multiple operating modes. For example, in the dual-core architecture, a RAM module having a burst mode may be beneficially used to assist the CPU in data processing, while a RAM module having a random access mode may be beneficially used to assist the DSP in data processing. The burst mode capability allows the CPU to continuously input and output data without receiving a new external address so that it can quickly process relatively large units of information, such as data pages or packets. Whereas, the random access mode allows the DSP to have relatively greater control over the multimedia information undergoing some complicated processing procedure, such as video processing, etc., as opposed with the burst mode which offers notably less control.

In cases where the host system has the dual-core architecture described above, as long as the system includes only one RAM module, data processing operations for the CPU and DSP must typically required be performed in sequence. In other words, parallel hyper-threading cannot be implemented in such a system, and hence the system's performance is limited. In cases where multiple RAM modules are individually mounted on respective processor modules, the system performance is improved, but the cost of the system increases in proportion with the number of RAM modules provided. Power consumption likewise increases in proportion with the number of RAM modules provided, and difficulties related to the size of the system also arise. In a portable electronic system, power consumption and size are critical issues, and therefore mounting a plurality of RAM modules corresponding to respective processor modules within a host system is generally undesirable.

Hence, other approaches have been proposed to address the competing characteristics of performance verses size and power consumption. A memory architecture having a divided word line in one such approach, wherein power consumption is reduced while maintaining or improving operating speed. An example of a conventional memory architecture having a divided word line structure is provided in "Divided Word-Line Structure in the Static RAM," IEEE Journal of Solid-State Circuits, Vol. SC-18, No. 9 (October, 1983). The conventional memory architecture is illustrated in FIG. 1.

Referring to FIG. 1 a memory cell array 10 is divided into cell array blocks 10a through 10h. Writing data to and reading data from memory cell array 10 is controlled by a row address buffer 6, a column address buffer 2, a block selector 4, a row decoder 8, column decoders 12 and 13, read/write circuits 16 and 17, and a data input/output buffer 20.

Each of cell array blocks 10a through 10h are connected to eight I/O terminals I/O 1 through I/O 8. Row decoder 8 is driven by a row address X0-Xn applied to row address buffer 6, but only one block is selected from cell array blocks 10a through 10h, and therefore only one word line corresponding to the selected cell array block is driven. The three most significant bits (MSBs) in a column address Y0-Ym are allocated as a block selection address Y0-Y2 to select the cell array block. Block selector 4 is designed to activate one selected cell array block at a time. In this case, block selection address Y0-Y2 is also applied to a column decoder 12 to allow only a selected column of the selected cell array block to be driven.

In cases where only one word line of the selected cell array block is driven as in the configuration of FIG. 1, the number of memory cells operationally connected with the word line and parasitic resistance-capacitance (RC) loading of the word line is significantly reduced. Hence, cell current consumption is reduced and data access operations, including reads and writes, are sped up.

Unfortunately, however, semiconductor memory devices having the architecture shown in FIG. 1 can only select one cell array block at a time using block selector 4. As a result, data access operations for different cell array blocks cannot be performed simultaneously. Accordingly, where the cell array blocks are simultaneously driven, a data bus DBUS between read/write circuits 16 and 17 and a data input/output buffer 20 has a wired-or structure designed to select data for a particular cell array block. In addition, where memory cell array 10 is manufactured to have predetermined divisions between cell array blocks, the size of the cell array blocks cannot be changed.

Hence, even in cases where a RAM module having the architecture shown in FIG. 1 is used in a dual core architecture, it is still difficult to achieve hyper-threading.

Because support for hyper-threading is desired in many contemporary data processing applications, what is needed is a semiconductor memory device that overcomes at least the shortcomings of the devices described above. In particular, what is needed is a semiconductor memory comprising a single chip and yet capable of providing the operational capability of multiple memory chips.

SUMMARY OF THE INVENTION

According to the present invention, a semiconductor memory device is provided. In addition, a method of operating a semiconductor memory is provided.

According to one embodiment of the present invention, a semiconductor memory device comprises a memory cell array having a plurality of cell array blocks and a memory plane determining unit operationally dividing the memory cell array into a plurality of memory planes. Each memory plane comprises at least one cell array block and has an operating mode that is independent of the other memory planes.

According to another embodiment of the present invention, a semiconductor memory device comprises a memory cell array having a plurality of cell array blocks. The semiconductor memory device further comprises a plane definition logic unit receiving a plane definition command and generating memory plane definition data and a bus switching control signal in response to the plane definition command. The bus switching control signal controls switches in a data bus transferring data between the cell array blocks and respective input/output (I/O) terminals. The semiconductor memory device further comprises a block selection path receiving the memory plane definition data and selectively driving cell array blocks corresponding to the plurality of memory planes in response to the memory plane definition data. The semiconductor memory device still further comprises a row/column decoding path divided according to the cell array blocks and a read/write path allowing different memory planes to have different operating modes with respect to data access operations.

According to still another aspect of the present invention, a method of operating a semiconductor memory device having a memory cell array comprised of a plurality of cell array blocks is provided. The method comprises operationally dividing the memory cell array into a plurality of memory planes, where each memory plane has at least one cell array block and an operating mode independent of the other memory planes. The method further comprises performing simultaneous, independent data access operations for different memory planes in the plurality of memory planes.

Embodiments of the present invention allow a single memory chip to support perform parallel hyper-threading operation for a host system, thereby allowing an increase in system's performance without requiring additional memory chips. As a result, a corresponding increase in the space or price required by the memory system is avoided.

BRIEF DESCRIPTION OF THE DRAWINGS

The invention is described below in relation to several embodiments illustrated in the accompanying drawings. In FIGS. 2 through 9 of the drawings, like reference numbers indicate like exemplary elements, components, or steps. In the drawings:

FIG. 2 is a circuit diagram illustrating a memory architecture for a semiconductor memory device according to one embodiment of the present invention;

FIG. 3 is a waveform timing diagram for exemplary read operations in a semiconductor memory device having the memory architecture illustrated in FIG. 2;

FIG. 4 is a circuit diagram illustrating an example of a plane definition logic unit shown in FIG. 2;

FIG. 5 is a circuit diagram illustrating an example of a switch shown in FIG. 2;

FIG. 6 is a circuit diagram illustrating an example of a block selection path shown in FIG. 2;

FIG. 8 illustrates an example of a read/write path according to another embodiment of the present invention; and, FIG. 9 is a waveform timing diagram illustrating the operation of the read/write path shown in FIG. 8.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 2:
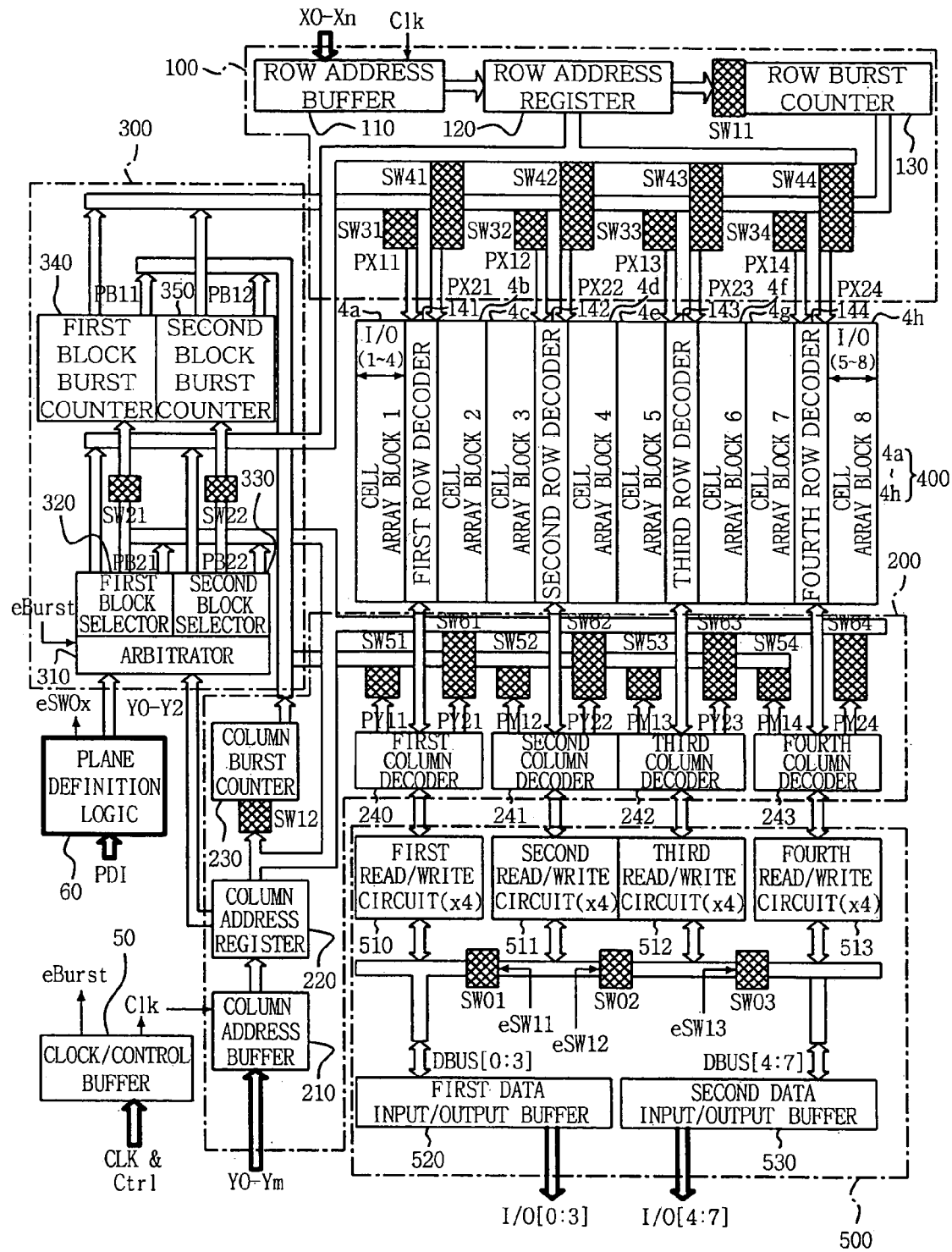

FIG. 2 is a circuit diagram illustrating a memory architecture for a semiconductor memory device according to one embodiment of the present invention. Referring to FIG. 2, a semiconductor memory device comprises a clock/control buffer 50, a plane definition logic unit 60, a row decoding path 100, a column decoding path 200, a block selection path 300, a memory cell array 400 including a plurality of cell array blocks 4a through 4h, and a read/write path 500. Row decoding path 100 should be viewed to include first through fourth row decoders 141-144 in addition to those elements shown within a broken box corresponding to row decoding path 100. Plane definition logic unit 60 and block selection path 300 collectively function as a memory plane determining unit.

Figure 1:
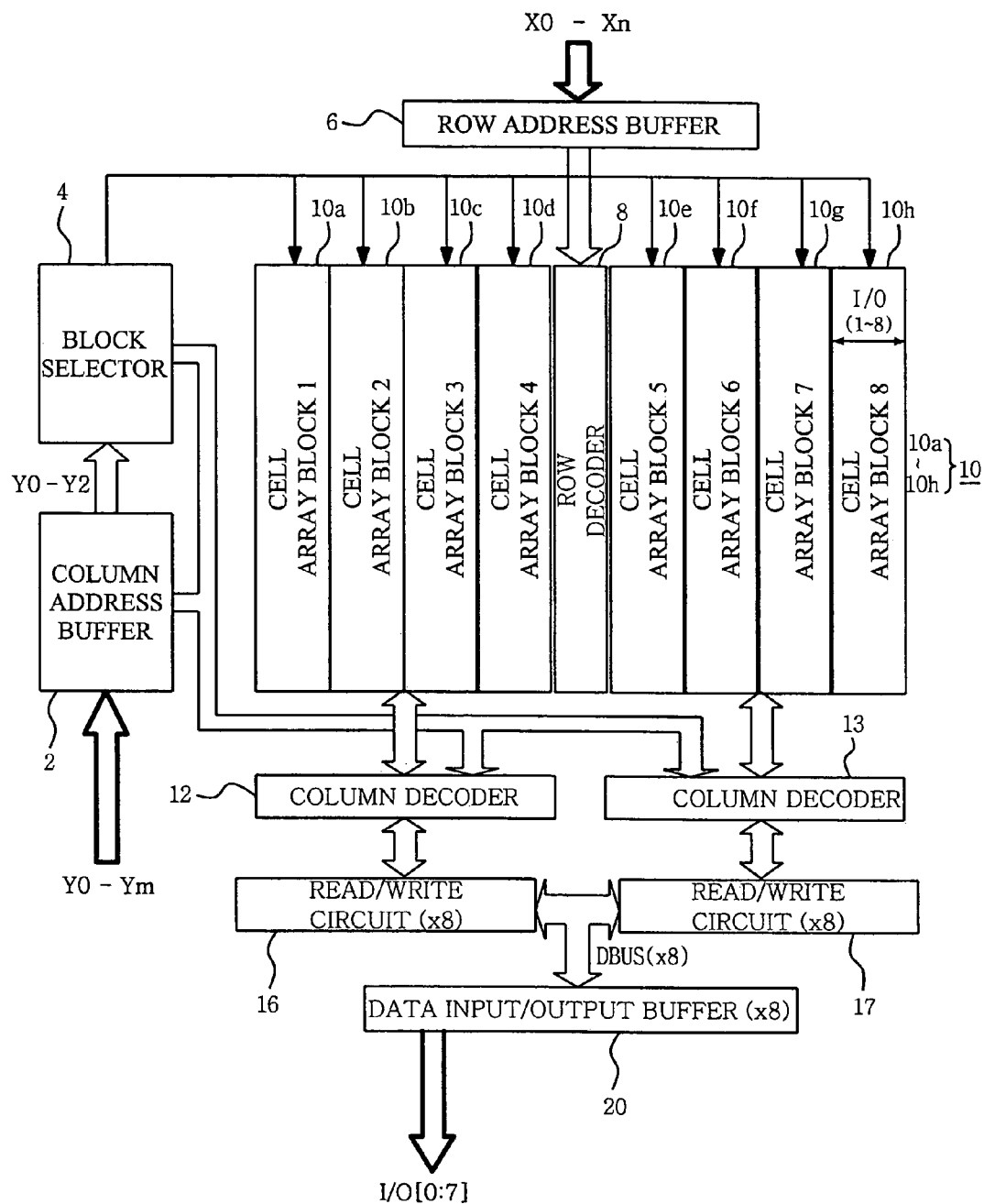
FIG. 1 is circuit diagram illustrating a conventional memory architecture for a semiconductor device.

Memory cell array 400 shown in FIG. 2 comprises cell array blocks 4a through 4h. Each cell array block is connected to four of a total of eight I/O terminals. Contrast this with memory cell array 10 in FIG. 1 where each cell array block is connected to all eight I/O terminals. Because each cell array block in FIG. 2 is connected to four I/O terminals, a data input/output operation using all eight I/O terminals is performed by accessing two cell array blocks.

Each cell array block contains a plurality of memory cells in a row and column matrix. Typically, each memory cell comprises a 6-transistor type SRAM cell constructed with full complementary metal-oxide semiconductor (CMOS) transistors.

Four row decoders are provided for the cell array blocks in FIG. 2. Using the row decoders, a word line for two cell array blocks is first selected, and then using a block selector, a word line for only one of the two cell array blocks is selected and subsequently driven. Contrast this with memory cell array 10 in FIG. 1 where one row decoder is provided for eight cell array blocks. Using the row decoder, a word line for all eight cell array blocks is initially selected, and then using a block selector, a word line for only one of the eight cell array blocks is selected and subsequently driven. In memory cell array 400, the number of row decoders can be changed and thus a corresponding word line decoding system can also be changed.

Cell array blocks 4a through 4h in memory cell array 400 are organized into four pairs, where each pair of cell array blocks is connected to a corresponding row decoder. Each cell array block is assigned to four I/O terminals among a total of eight I/O terminals, and therefore two cell array blocks can be selected simultaneously. Memory cell array 400 can therefore be said to have two memory planes, i.e. two virtual chips within the array. In a case where all eight I/O terminals are used, the number of dividable cases for each memory plane is three.

The number of memory planes and the number of dividable cases can be changed depending on the configuration of the memory cell array. For example, assume that the memory cell array comprises eight cell array blocks, wherein four I/O terminals are assigned to each cell array block. Assume that eight row decoders corresponding to each of the respective cell array blocks are formed in the memory cell array and that all eight I/O terminals are used. In this case, the number of memory planes is two and the number of dividable cases for each memory plane is seven. In general, for memory cell array 400, assuming that the number of memory planes is "P", and the number of independent row decoders is "B", the number of dividable cases "DC" can be obtained by the formula $DC=[(B-P)+1] \times [(P-1)!]$. In the formula, B is a minimum number of row decoders.

Figure 3:
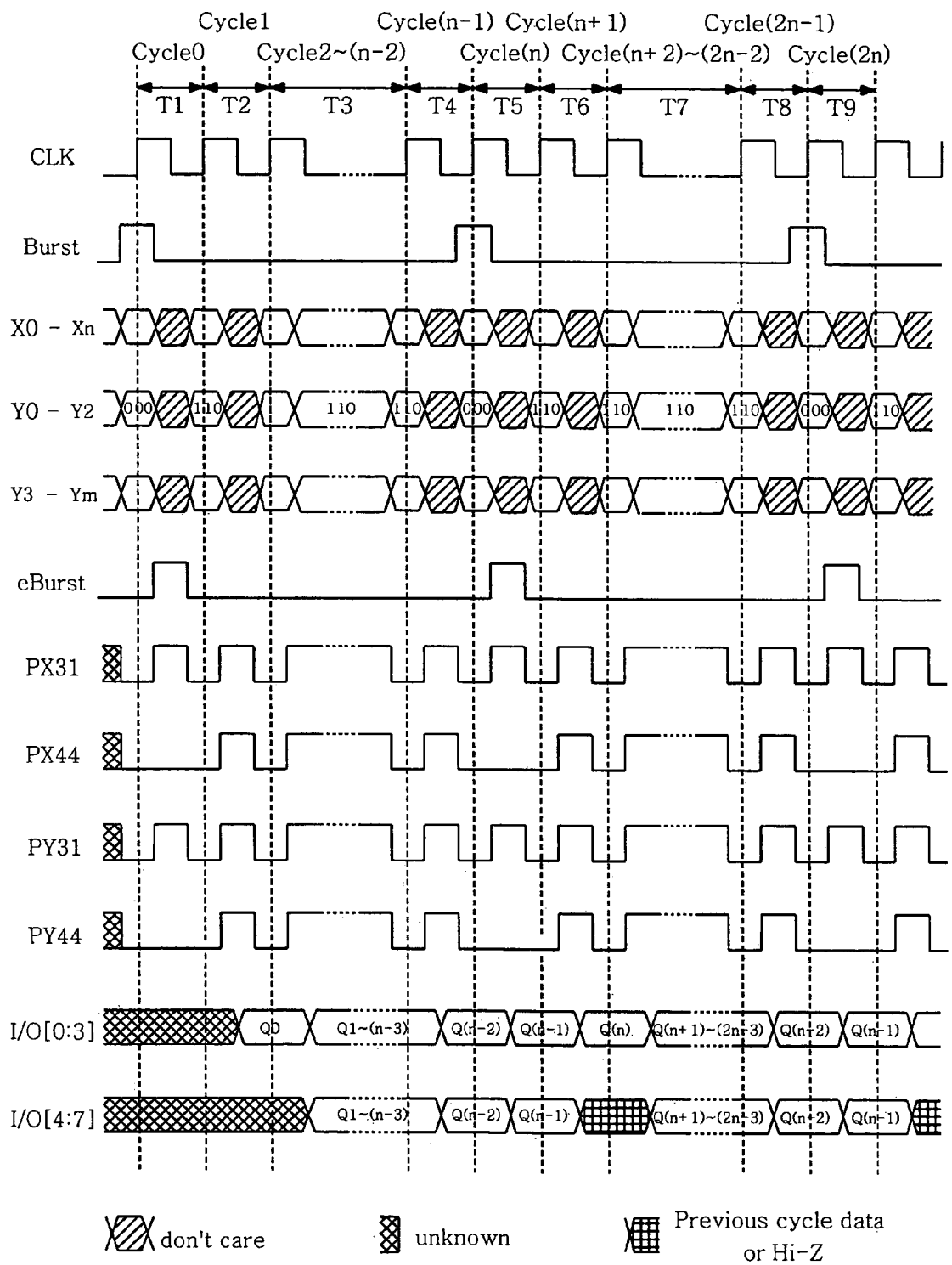

FIG. 3 is a waveform timing diagram for an exemplary read operation in a semiconductor memory device having the memory architecture illustrated in FIG. 2. In FIG. 3, the following is assumed. It is assumed that the semiconductor memory device is synchronized with a clock and that an output to an external terminal has a conventional pipeline operation. It is further assumed that the memory cell array is divided into two memory planes. In addition, it is assumed that a first memory plane is determined by first through sixth cell array blocks 4a through 4f, and that a second memory plane is determined by seventh and eighth cell array blocks 4g and 4h. The first memory plane inputs and outputs data in a burst mode through first through fourth I/O terminals I/O[0:3] and the second memory plane inputs and outputs data in a random access mode through fifth through eighth I/O terminals I/O[4:7]. A burst length has a variable duration of "n" cycles.

In accordance with the above stated assumptions, memory cell data selected in an initial cycle Cycle0 is synchronized with a clock signal CLK during a first cycle Cycle1, and is output as a data output Q0. Cell data selected in first cycle Cycle1 is synchronized with clock signal CLK in a second cycle Cycle2, and is output as a data output Q1. A determination of the memory planes formed by the cell array blocks and a definition for an I/O terminal configuration and operating method are designated through an external input. Determination of the memory planes is made by a plane definition logic unit 60, a detailed description of which will be provided later.

Referring to FIG. 2, clock/control buffer 50 is a conventional device used to buffer and process clock signals and various control signals. In general, clock signals and control signals output by clock/control buffer 50 are applied to circuit elements within a chip.

Plane definition logic unit 60 generates a bus switching control signal eSW0x to divide memory cell array 400 into one or more memory planes and to perform simultaneous, independent data access operations for respective memory planes in response to plane definition command PDI applied thereto.

Figure 4:
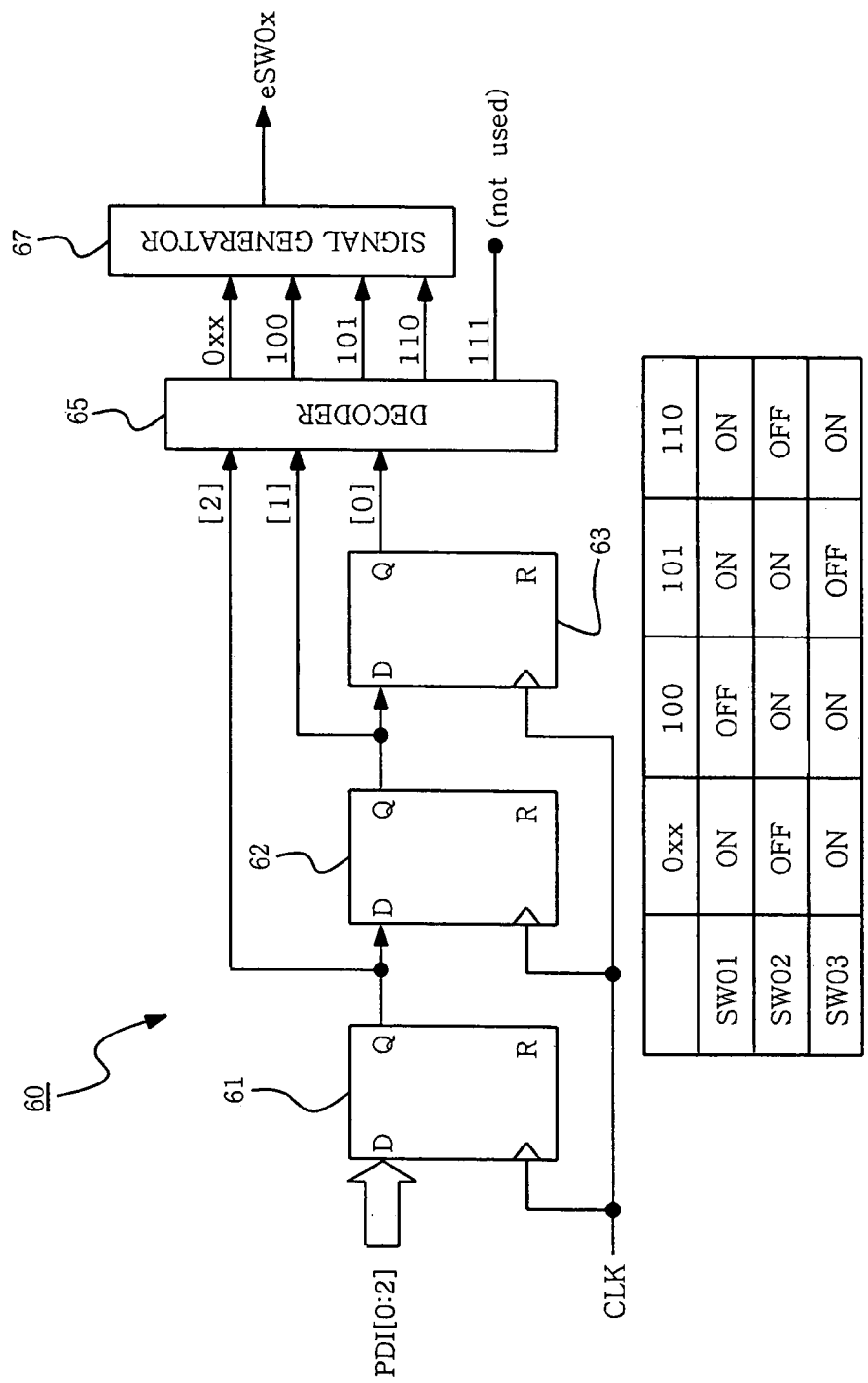

FIG. 4 is a circuit diagram illustrating an example of plane definition logic unit 60. Referring to FIG. 4, plane definition logic unit 60 comprises three flip-flops 61, 62 and 63, in which output terminals "Q" and input terminals "D" are connected in series to process a 3-bit plane definition command PDI. Plane definition logic unit 60 further comprises a decoder 65 decoding latch data output by output terminals "Q" of respective flip-flops 61, 62 and 63, and a signal generator 67 generating a switching control signal eSW0x in response to an output of decoder 65.

Decoder 65 produces four different values which are used by signal generator 67, namely, '0xx', '100', '101', '110'. The four values produced by decoder 65 are used to derive bus switching control signal eSW0x, which is used to control three bus switches SW01, SW02, and SW03 connected to data buses DBUS shown in a lower portion of read/write path 500 in FIG. 2. In addition, the four values produced by decoder 65 constitute memory plane definition data.

The following explanation will serve to further illustrate the operation of the exemplary plane definition logic unit 60 in FIG. 4.

Where plane definition command PDI has the value '0xx', memory cell array 400 has a one memory plane configuration. In this case, as shown in a state table illustrated in a lower part of FIG. 4, bus switch SW02 is turned off and the bus switches SW01 and SW03 are turned on. First through fourth cell array blocks 4a-4d are each connected to first through fourth I/O terminals I/O[0:3], and fifth to eighth cell array blocks 4e-4h are each connected to fifth through eighth I/O terminals I/O[4:7].

Where plane definition command PDI has the value '100', bus switch SW01 is turned off and bus switches SW02 and SW03 are turned on. In this case, memory cell array 400 has a two memory plane configuration. A first memory plane occupies ¼ of memory cell array 400, and a second memory plane occupies the remaining ¾ of memory cell array 400. In other words, first and second cell array blocks 4a and 4b form the first memory plane, and third through eighth cell array blocks 4c-4h form the second memory plane.

Where plane definition command PDI has the value '101', bus switch SW03 is turned off and bus switches SW01 and SW02 are turned on. In this case, memory cell array 400 has a two memory plane configuration wherein the first memory plane occupies ¾ of entire memory cell array 400, and the second memory plane occupies the remaining ¼ of memory cell array 400.

Where plane definition command PDI has the value '110', the first and second memory planes each occupy ½ of memory cell array 400. In this case, bus switches SW01 and SW03 are turned on and switch SW02 is turned off. As a result, read/write operations and decoding path operations are performed independently for respective memory planes.

Although plane definition command PDI shown in FIG. 3 has 3 bits, the number of bits can be changed according to different configurations or applications for semiconductor memory devices.

Figure 5:
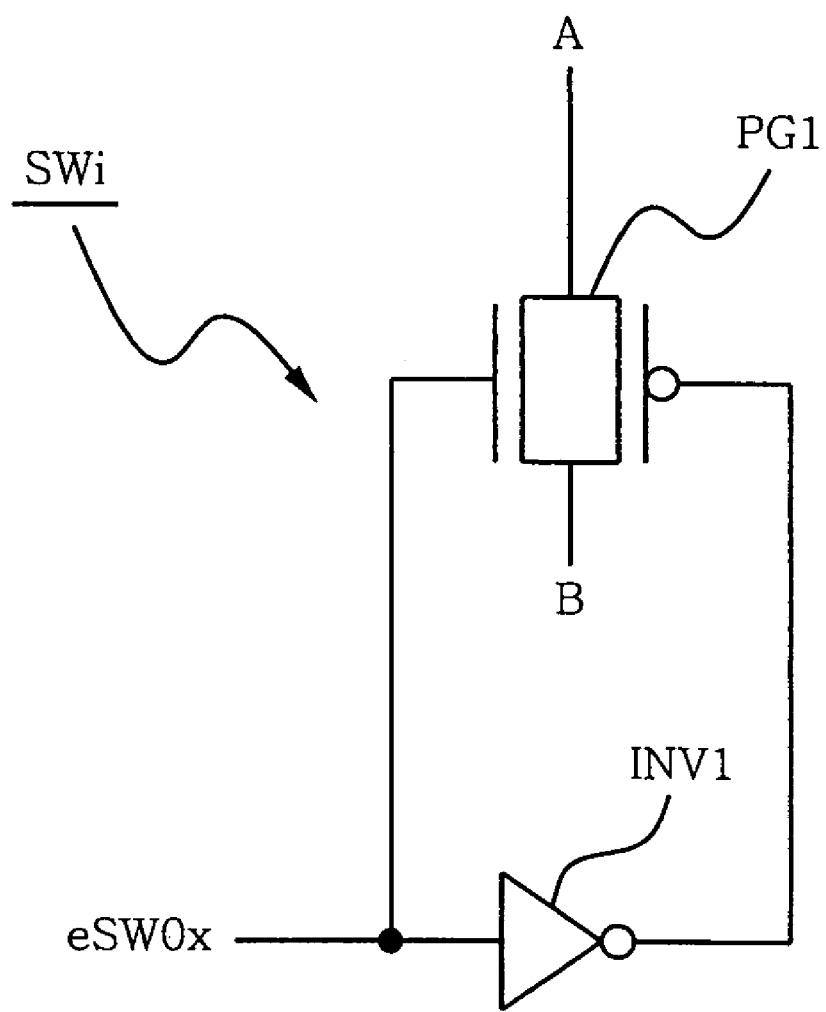

FIG. 5 is a circuit diagram illustrating an example of a switch such as those shown in FIG. 2. Referring to FIG. 5, a bus switch SWi comprises a CMOS pass gate PG1 and an inverter INV1. Bus switching control signal eSW0x is applied to an input of inverter INV1 and a first terminal of CMOS pass gate PG1 and an output of inverter is connected to a second terminal of CMOS pass gate PG1. Bus switch SWi is turned on in a case where bus switching control signal eSW0x is applied thereto at a logic level 'high'. As a result, a node "A" and a node "B" are electrically connected across CMOS pass gate PG 1. Alternatively, where bus switching control signal eSW0x is applied to bus switch SWi at a logic level 'low', bus switch SWi is turned off, and nodes "A" and "B" are electrically insulated.

Figure 6:
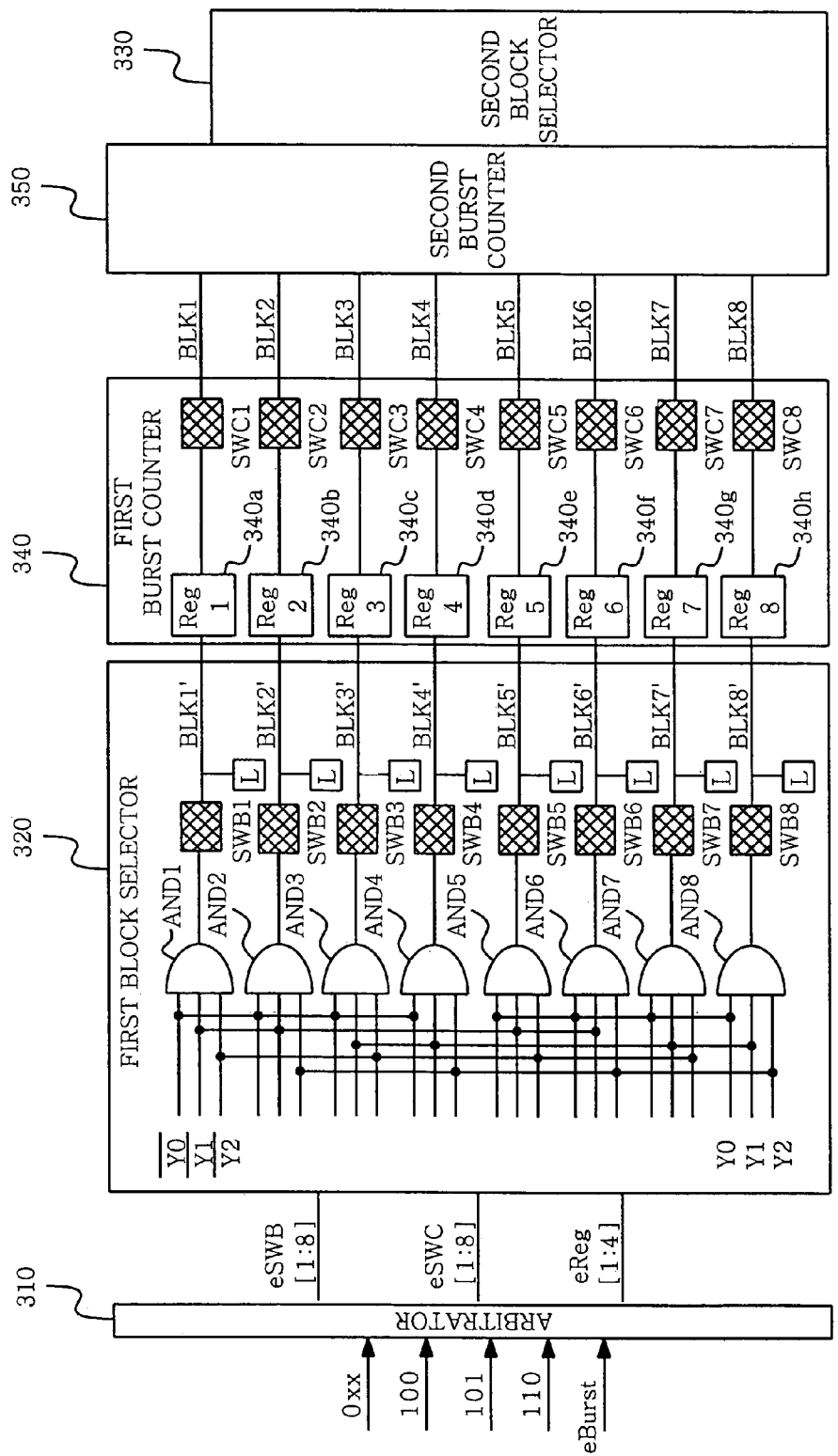

FIG. 6 is a circuit diagram illustrating an example of block selection path 300 shown in FIG. 2. Referring to FIG. 6, block selection path 300 comprises a cell block selection arbitrator 310, first and second block selectors 320 and 330, and first and second burst counters 340 and 350. Cell block selection arbitrator receives memory plane definition data (e.g. '0xx', '100', '101', '110') in FIG. 4 and an internal burst signal eBurst supplied by clock/control buffer 50 in order to divide cell array blocks within a memory cell array 400 into memory planes. First block selector 320 receives block selection address Y0-Y2 indicating one of the cell array blocks from a column address register 220 in column decoding path 200.

Where the memory plane definition data has the value '0xx', first and second block selectors 320 and 330 and first and second burst counters 340 and 350 perform an integrated function, acting as a single block selector and burst counter. For example, where block selection address Y0-Y2 has 3-bits, eight cell array blocks are sequentially selected in a burst operation. In any case where the memory plane definition data has the value '0xx', regardless of whether a burst operation or a random access operation is in effect, multiple cell array blocks are not selected simultaneously. In this case, switches SW21 and SW22 within block selection path 300 shown in FIG. 2 are turned on or off according to an output of arbitrator 310 and clock/control buffer 50 in order control the transfer of a burst command. For example, where the memory plane definition data has the value '0xx', one of selection switches SW21 and SW22 is always turned off so that first and second block selectors 320 and 330 and first and second burst counters 340 and 350 function as an integrated unit. The remaining selection switch may also be turned off so that a burst counter does not factor into the selection of a cell array block.

In cases where the memory plane definition data has values '100', '101', or '110', and a burst command is executed for each memory plane, a corresponding switch is turned on. Where a random access operation is executed, the same switch is turned off. In other words, switch SW21 is turned on and off according to an operating mode of the first plane, and a switch SW22 is turned on and off according to an operating mode of the second plane.

Arbitrator 310 controls switches SW21 and SW22 by turning them on or off. In addition, arbitrator 310 outputs control signals to control circuit devices shown in FIG. 6. By controlling the circuit devices, data access operations for respective memory planes can be performed simultaneously and independently. Hence, memory functions necessary to support hyper-threading in a host system are provided.

Arbitrator 310 receives a clock signal Clk from clock/control buffer 50. Clock signal Clk (not shown in FIG. 6) is applied to arbitrator 310 in order to provide synchronization for signals relating thereto. Internal burst signal eBurst received by arbitrator 310 from clock/control buffer 50 is a buffered version of an external burst mode entry signal Burst. Control data eSWB[1:8] and eSWC[1:8] output by arbitrator 310 is switching data used to control switches SWB[1:8] and SWC[1:8] in first block selector 320. Control data eReg[1:4] output by arbitrator 310 is register decision data used to indicate registers among registers 340a through 340h in burst counter 340.

Where the memory plane definition data has the value '0xx', eight cell array blocks are grouped together as a single memory plane. In this case, a block selector and a burst counter are integrated as a unified functional unit. Where first block selector 320 and first burst counter 340 are integrated, switches SWB[1:8] within first block selector 320 and switches SWC[1:8] within first burst counter 340 are all turned on. Meanwhile, switches SWC[1:8] within second burst counter 350 are all turned off. Thus, eight cell array blocks constituting one memory plane are selected according to corresponding block selection signals BLK[1:8]. In this case, an output of second burst counter 350 ignores block selection signal BLK[1:8] since switches within second burst counter 350 are all turned off. In this case, it does not matter whether switches within second block selector 330 are turned on or off.

Where the memory plane definition data has the value '100', a first memory plane occupies ¼ of memory cell array 400 and a second memory plane occupies the remaining ¾ of memory cell array 400. Switches SWB[1:2] and SWC[1:2] within first block selector 320 and the first burst counter 340 are turned on, and switches SWB[3:8] and SWC[3:8] are turned off. Switches SWB[1:2] and SWC[1:2] within second block selector 330 and second burst counter 350 are turned off, and switches SWB[3:8] and SWC[3:8] are turned on. In other words, switches within second block selector 330 and second burst counter 350 have opposite values from their corresponding counterparts in first block selector 320 and first burst counter 340 respectively.

Where the memory plane definition data has the value '101', a first memory plane occupies ¾ of memory cell array 400, and a second memory plane occupies the remaining ¼ of memory cell array 400. Switches SWB[1:6] and SWC[1:6] within first block selector 320 and first burst counter 340 are turned on, and remaining switches SWB[5:8] and SWC[5:8] are turned off.

Where the memory plane definition data has the value '110', switches SWB[1:4] and SWC[1:4] within first block selector 320 and first burst counter 340 are turned on, and remaining switches SWB[5:8] and SWC[5:8] are turned off.

The registers in first and second burst counters perform counting operations according to the value of the memory plane definition data. For example, where the memory plane definition data has the value '101', first through sixth registers 340a-340f within first burst counter 340 are used for counting in the first memory plane while the first memory plane is in burst mode. Suppose, in addition, that the second memory plane is in random access mode. In this case, seventh and eighth registers 340g and 340h will not operate.

The registers used for counting typically store a binary number which is incremented (i.e. the registers are incremented) by a counting process until a predetermined count is reached, upon which the registers are reset and counting begins again. Usually the predetermined count is indicated by a transition in a value stored in one of the registers used for counting. The selection of such a register is indicated by control data eReg[1:4] of arbitrator 310.

In FIG. 6, where control data eReg1 of control data eReg[1:4] is selected, first and second registers 340a and 340b are incremented in a first memory plane and third through eighth registers 340c-304h are incremented in a second memory plane. Where control data eReg2 is selected, first through fourth registers 340a-340d are incremented in a first memory plane, and fifth through eighth registers 340e-340h are incremented in a second memory plane. Where control data eReg3 is selected, first through sixth registers 340a-340f are incremented in a first memory plane, and seventh and eighth registers Reg7 and Reg8 are incremented in a second memory plane. Where control data eReg4 is selected, first through eighth registers 340a-340h are incremented in a first memory plane, and no registers are used in a second memory plane.

The memory plane determining unit composed of block selection path 300 and plane definition logic unit 60 operationally divides memory cell array 400 into a plurality of memory planes, each connected to one or more cell array blocks having an independent operating mode, in response to a command.

The operation of various circuit blocks, including block selection path 300, will now be described in further detail with respect to the waveform timing diagram shown in FIG. 3.

Assuming that a plane definition command PDI is applied to plane definition logic unit 60, and that the memory plane definition data has the value '101'. As a result, a first memory plane is determined to comprise cell array blocks 4a-4f and to occupy ¾ of the total memory cell array. A second memory plane is determined to comprise remaining cell array blocks 4g and 4h and to occupy ¼ of the total memory cell array. Assuming that in the first memory plane, a burst mode has a duration of "n" cycles, where "n" is a natural number larger than 2, and that a second memory plane has a random access mode. This case, wherein two operating modes are performed simultaneously and independently, will now be described.

Prior to an operating interval T1 in FIG. 3, all circuitry related to defining first and second memory planes is initialized. In initial cycle Cycle0, block address Y0-Y2 has the value '000', thereby selecting cell array block 4a assigned to the first memory plane. An optional row/column address is sampled, and simultaneously, an external burst signal "Burst" indicating the start of burst mode is sampled as 'HIGH'. A switch SW21 within block selection path 300 in FIG. 2 is turned on in order to operationally connect first block selector 320 with first burst counter 340. Internal burst signal eBurst generated by an external burst signal assumes a logic level 'HIGH' during interval T1 in initial cycle Cycle0. Thus, switch devices SWB[1:6] in first block selector 320 of FIG. 6 are turned on and block address information synchronizing to clock Clk is stored in latches "L" connected with nodes BLK[1-6]'. At the same time, block address information is individually applied to first through sixth registers 340a-340f within first burst counter 340. During interval T1 prior to cycle Cycle1, internal burst signal eBurst assumes a logic level 'LOW' and switches SWB[1:6] are turned off. Hence, before a next burst operation for the first memory plane is performed by another address input, a new cell array block is selected according to the operation of first burst counter 340.

The semiconductor memory device having the architecture illustrated in FIG. 2 is assumed to have a first pipeline stage with a latency of 2 for purposes of illustration in FIG. 3. In other words, output data Q0[0:3] accessed in initial cycle Cycle0 is synchronized to external clock signal CLK in first cycle Cycle1 and output through I/O[0:3] in second cycle Cycle2. Overall, the semiconductor memory device is assumed to have a four stage pipeline requiring 3,1,1, and 1 cycles in the respective first through fourth stages. During first cycle Cycle1, a state of I/O[4:7] has an unknown state because an operating state for a second memory plane previous to initial cycle Cycle0 is not confirmed. In first cycle Cycle1, block address Y0-Y2 having the value '110' is used to select cell array block 4g assigned to the second memory plane, and a corresponding row/column address is sampled. At the same time, external control signal "Burst" indicating a random access operation rather than a burst operation is sampled as a logic level 'LOW'. Thus, in interval T2, none of the cell array blocks corresponding to the first memory plane is selected, and since a cycle just before is a burst mode, a read operation for the first memory plane is continued regardless of the sampled external information.

In a second memory plane in interval T2, switch SW22 in block selection path 300 shown in FIG. 2 is turned off so as not to operationally connect second block selector 330 with second burst counter 350. Thus, selection of cell array block 4g is performed by an output PB22 of second block selector 330 shown in FIG. 2. In other words, a selection operation for a cell array block in the second memory plane is performed regardless of a logic state of internal burst signal eBurst.

In cycle Cycle2 occurring in an interval T3 following interval T2, output data Q1[0:3] of the first memory plane, which operates in burst mode in cycle Cycle1, synchronizes to external clock CLK and is output through I/O[0:3]. Simultaneously, output data Q1[4:7] of the second memory plane, which is operating in random access mode in cycle Cycle2, is output through I/O[4:7].

A burst operation performed in the first memory plane in cycle Cycle1 can be continuously executed without an external address input, until cycle Cycle(n), where a new burst operation starts with a new address input. In case it is unnecessary to perform a burst operation with duration "n", a new burst operation can be generated by a new address before or after "n" cycles. In this case, a burst operation for the first memory plane is continued only until that operation cycle.

Meanwhile, the operating mode for the second memory plane is not limited to random access mode, but can also be determined to be burst mode. In other words, a burst continue operation and a random access operation for respective memory planes are each determined, or a burst continue operation and a burst continuation operation or burst start operation can be respectively determined.

While a particular case illustrating a read operation is shown in FIG. 3, a write operation can be also performed for respective memory planes using a similar timing scheme. Since row/column decoding paths are divided according to different memory planes, a read operation can be performed in one memory plane while a write operation is performed in another memory plane. In fact, even where three or more memory planes exist, they can operate as separate entities. Accordingly, in a method of creating memory plane divisions according to the present invention, even though only one memory chip is mounted in a system, the memory chip can be divided into a plurality of memory planes with variable sizes, and data accesses to respective planes can be performed independently and simultaneously for separate processor modules. As a result, multiple data access operations can be performed simultaneously.

Referring to FIG. 3, in a cycle Cycle(n), a new row/column address different from the row/column address applied in initial cycle Cycle0 is applied to the first memory plane, and a new burst mode operation starts. New or the same block address information is stored in latch "L" of FIG. 6 through a series of internal operations similar to operations performed in initial cycle Cycle0, and output data Qn[0:3] of first memory plane synchronizes to a cycle Cycle(n+1) and is output through I/O[0:3]. In cycle Cycle (n), a block selection is not performed for the cell array block of the second memory plane nor is a burst operation performed. As a result, there is no data Qn[4:7] to synchronize with clock signal CLK in cycle Cycle(n+1) and output. In this case, I/O[4:7] is either forced to a high impedance (high-Z) state or to maintain as an output state provided at cycle Cycle(n) as a cycle just before a data output. Where the second memory plane continues to operate in burst mode in cycle Cycle(n), output data Qn[4:7] is output through I/O [4:7] in cycle Cycle(n+1).

Figure 7A:
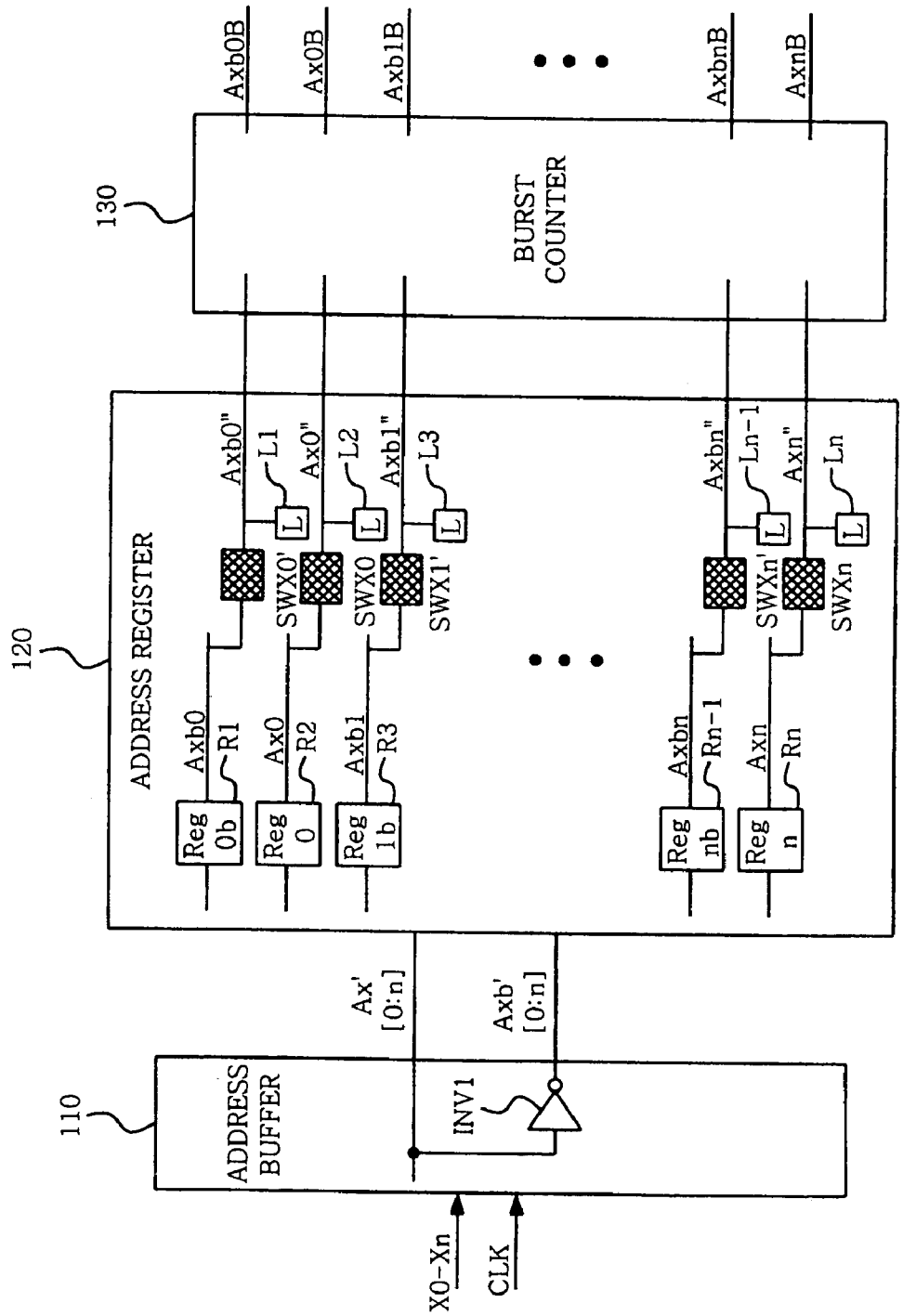
FIGS. 7a and 7b illustrate examples of a row decoding path and a column decoding path respectively, shown in FIG. 2.
Figure 7B:
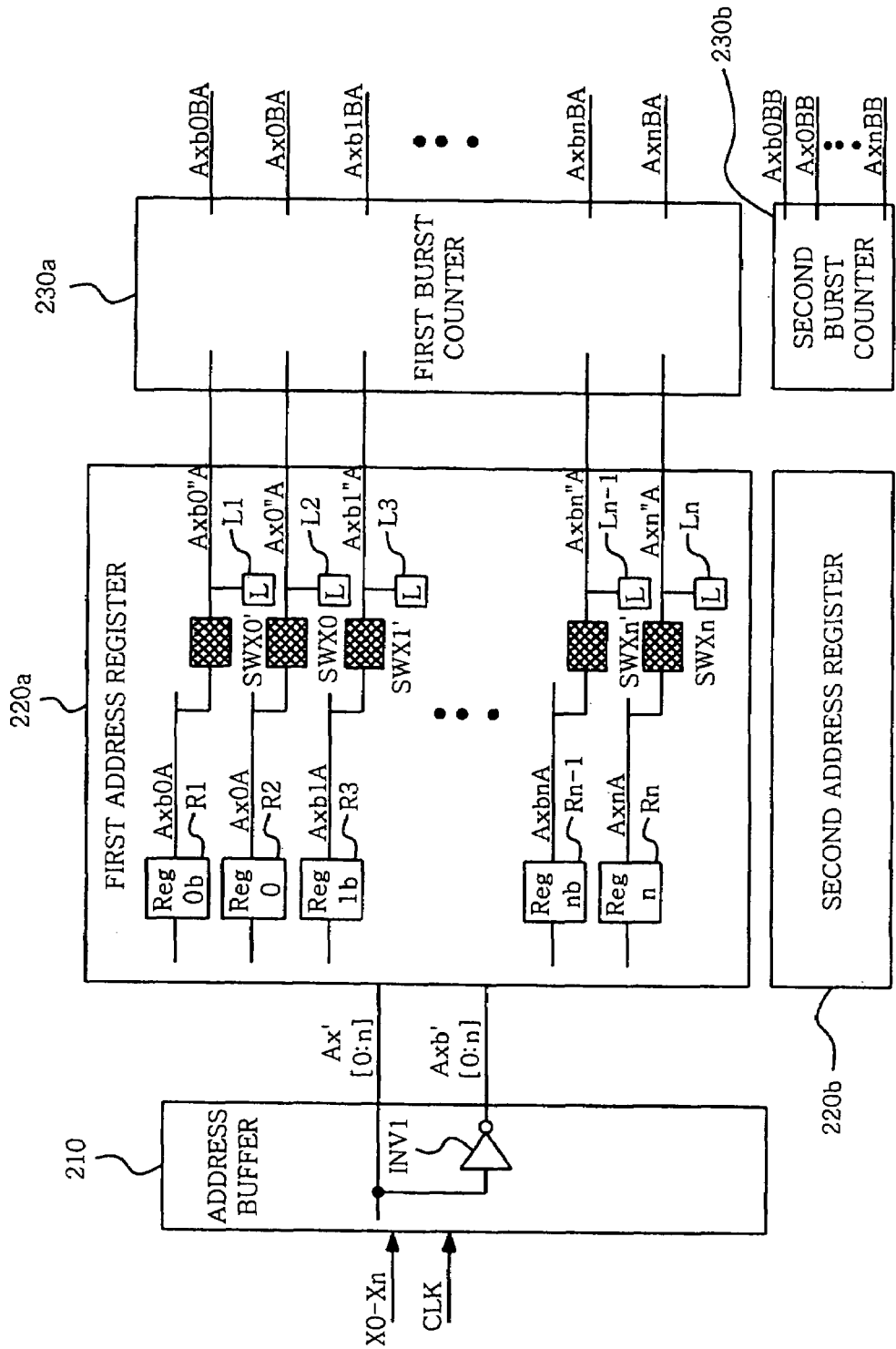

FIGS. 7a and 7b are circuit diagrams illustrating examples of row decoding path 100 and column decoding path 200 respectively.

Referring to FIG. 7a, row decoding path 100 comprises a row address buffer 110, an address register 120, and a burst counter 130. Switches within address register 120 perform switching on input terminals of burst counter 130. In initial cycle Cycle0 of FIG. 3, a switch SWXx within address register 120 is turned on to connect outputs of the address register 120 with input terminals of burst counter 130 of the first memory plane. In this case, functionality of arbitrator 310 of FIG. 6 is unnecessary because the row/column address itself is not divided according to a memory plane. Before first cycle Cycle1, switch SWXx is turned off, and thus a burst counter is not influenced by a row/column address, until a burst operation for a new address is generated in the first memory plane. During first cycle Cycle1, an output of the address register is directly applied to a next decoding terminal to drive the second memory plane in random access mode. The configuration of FIG. 7a designates a case where the first and second memory planes simultaneously operate in burst mode and random access mode, respectively.

Referring to FIG. 7b, column decoding path 200 comprises a column address buffer 210, first and second address registers 220a and 220b, respectively, and first and second burst counters 230a and 230b, respectively. Switches within address register 220 perform switching on input terminals of burst counter 230. In initial cycle Cycle0 of FIG. 3, a switch SWXx within address register 220 is turned on to connect outputs of the address register 220 with input terminals of burst counter 230 of the first memory plane. In this case, functionality of arbitrator 310 in FIG. 6 is unnecessary because the column address itself is not divided according to a memory plane. Before first cycle Cycle1, switch SWXx is turned off, and thus a burst counter is not influenced by a column address, until a burst operation for a new address is generated in the first memory plane. During cycle Cycle1, an output of address register is directly applied to a next decoding terminal to drive the second memory plane in random access mode.

The configuration of FIG. 7b illustrates first and second memory planes both operating simultaneously and independently in burst mode. The configuration has a scheme wherein the first and second address registers and first and second burst counters are configured so as to respectively provide a plurality of registers and burst counters.

Figure 8:
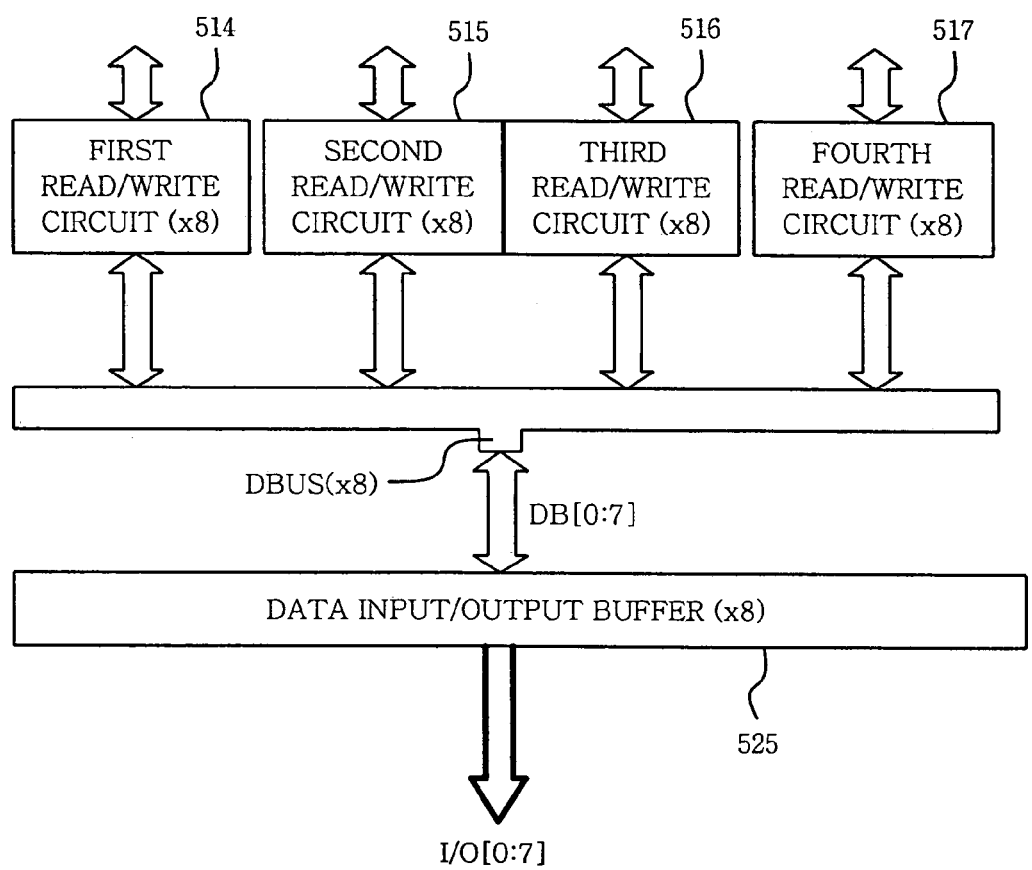

FIG. 8 illustrates an alternative structure for read/write path 500 shown in FIG. 2 according to another exemplary embodiment of the present invention. In FIG. 8, rather than dividing data bus DBUS[0:8] into two buses DBUS[0:3] and DBUS[4:7] and allocating different memory planes to each I/O terminal as in FIG. 2, all eight I/O terminals use the same data bus.

Figure 9:
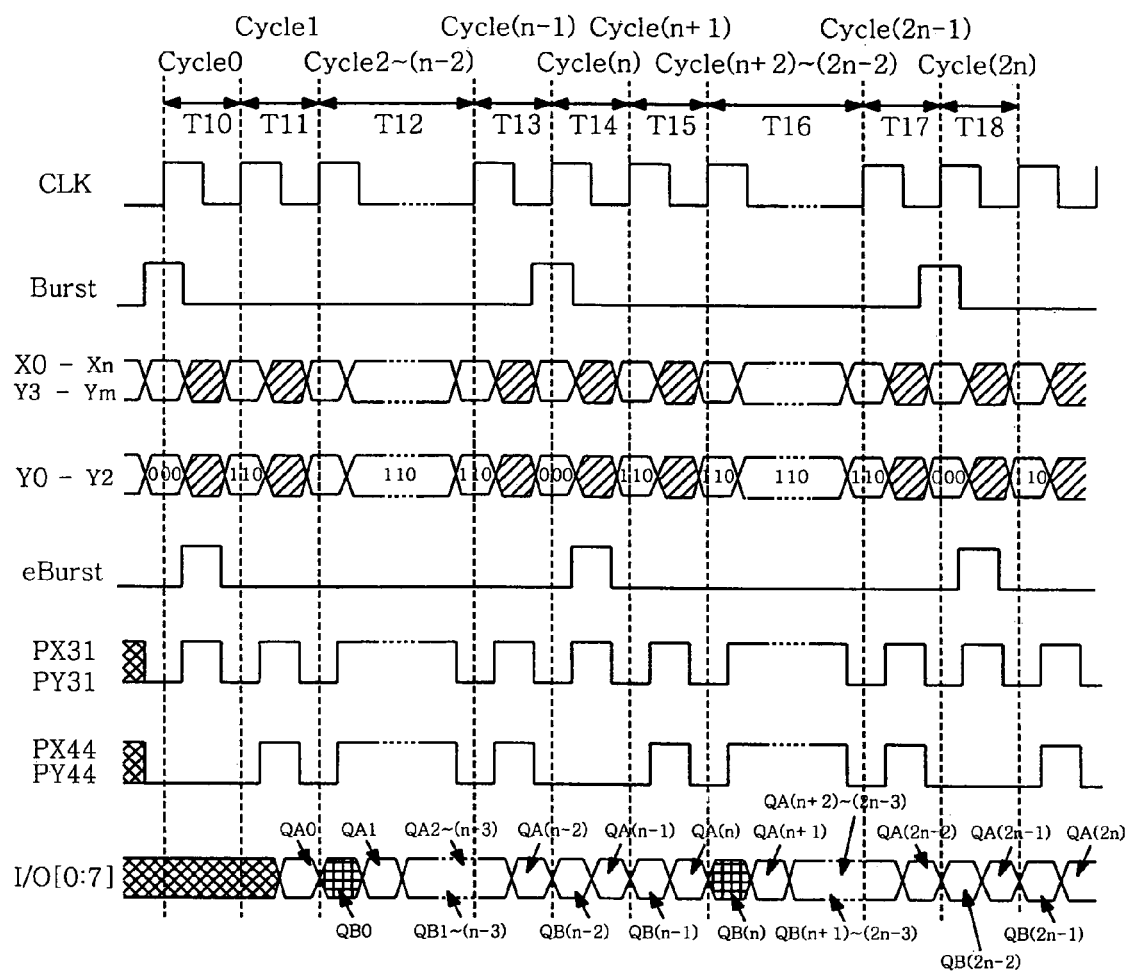

FIG. 9 is a waveform timing diagram illustrating the operation of the read/write path shown in FIG. 8. Similar to the case illustrated in FIG. 3, it is assumed in FIG. 9 that an entire memory cell array is divided into two memory planes. It is assumed that in a first memory plane, a burst operation having a duration of "n" cycles is performed, and in a second memory plane, a random access operation is performed. Selection and distribution of cell array blocks to configure memory planes and the row/column decoding method are the same as the selection and distribution of cell array blocks described in relation to FIG. 3. Thus, a detailed description of these will be omitted. Operations related to the read/write paths in FIG. 8 will be described as follows.

Data for two memory planes stored in read/write circuits or data input/output buffer 525 of FIG. 8 can be alternately output in one cycle through the same I/O terminal. For example, in FIG. 9, data QAi from the first memory plane is synchronized to a rising edge of external clock signal CLK and is output through I/O terminals I/O[0:7]. While data QBi from the second memory plane synchronizes to a falling edge of external clock signal CLK and is output through the same I/O terminal I/O[0:7]. Accordingly, the structure of FIG. 8 can be used to implement a memory supporting a simultaneous hyper-threading operation.

In cycle Cycle(n) of interval T14, a block selection is not generated for a cell array block of the second memory plane nor is a burst operation performed. As a result, there is no data QBn[4:7] to synchronize to cycle Cycle(n+1) and output. In this case, I/O terminals I/O[0:7] are controlled to assume a high impedance (high-Z) state or to maintain an output state provided at cycle Cycle(n) as seen in output data QB(n) in FIG. 9. Where the second memory plane operates in burst mode in cycle Cycle(n), output data QBn[4:7] is output through I/O terminals I/O[0:7] during operation cycle Cycle(n+1).

According to the present invention as described in relation to exemplary embodiments above, a memory system comprising a single chip can be operationally divided into memory planes capable of executing simultaneous, independent data access operations. Accordingly, processor modules can be provided with independent memory spaces and these memory spaces can operate in different modes according to the requirements of the processor modules. In other words, the single chip memory system us capable of parallel hyper-threading.

By providing parallel hyper-threading capability in a single chip memory system rather than using multiple memory chips, the present invention reduces the total area required by the memory system, thereby allowing devices containing the memory system to be more compact. In addition, because it uses only one memory chip, the memory system is less expensive than most multiple chip systems.

The exemplary embodiments of the present invention described herein are teaching examples. Those of ordinary skill will understand that various changes in form and details may be made thereto without departing from the scope of the present invention as defined by the following claims.

What is claimed:

1. A semiconductor memory device, comprising:
   a memory cell array having a plurality of cell array blocks; and,
   a memory plane determining unit operationally dividing the memory cell array into a plurality of memory planes and comprising;
   a plane definition logic unit receiving a plane definition command and generating memory plane definition data and a bus switching control signal in response to the plane definition command, wherein the bus switching control signal controls switches in a data bus transferring data between the cell array blocks and respective input/output (I/O) terminals; and, a block selection path receiving the memory plane definition data and selectively driving cell array blocks corresponding to the plurality of memory planes in response to the memory plane definition data;

wherein each memory plane comprises at least one cell array block and has an operating mode that is independent of the other memory planes.

2. The device of claim 1, wherein cell array blocks corresponding to different memory planes use different input/output (I/O) terminals.

3. The device of claim 1, wherein cell array blocks corresponding to different memory planes use a common set of input/output (I/O) terminals by alternately driving the I/O terminals.

4. The device of claim 3, wherein the I/O terminals are alternately driven by synchronizing data access operations corresponding to different memory planes to different clocks.

5. The device of claim 3, wherein the I/O terminals are alternately driven by synchronizing data access operations corresponding to different memory planes to different states of a single clock.

6. A semiconductor memory device, comprising:
a memory cell array having a plurality of cell array blocks;
a plane definition logic unit receiving a plane definition command and generating memory plane definition data and a bus switching control signal in response to the plane definition command, wherein the bus switching control signal controls switches in a data bus transferring data between the cell array blocks and respective input/output (I/O) terminals;
a block selection path receiving the memory plane definition data and selectively driving cell array blocks corresponding to the plurality of memory planes in response to the memory plane definition data;
a row/column decoding path divided according to the cell array blocks; and,
a read/write path allowing different memory planes to have different operating modes with respect to data access operations.

7. The device of claim 6, wherein cell array blocks corresponding to different memory planes use different I/O terminals.

8. The device of claim 6, wherein cell array blocks corresponding to different memory planes use a common set of I/O terminals by alternately driving the I/O terminals.

9. The device of claim 8, wherein the I/O terminals are alternately driven by synchronizing data access operations corresponding to different memory planes to different clocks.

10. The device of claim 8, wherein the I/O terminals are alternately driven by synchronizing data access operations corresponding to different memory planes to different states of a single clock.

11. The device of claim 6, wherein the block selection path comprises:
an arbitrator receiving the memory plane definition data and a generating a switching signal and a control signal for arbitrating selection of cell array blocks in response to the memory plane definition data;
first and second block selectors receiving the switching signal and generating a selection signal to select a cell array block in response to the switching signal; and,
first and second burst counters connected with the first and second block selectors through a selection switch, wherein the first and second counters determine the duration of burst operations.

12. A method of operating a semiconductor memory device having a memory cell array comprised of a plurality of cell array blocks, the method comprising:
operationally dividing the memory cell array into a plurality of memory planes, each memory plane having at least one cell array block and an independent operating mode; and,
performing simultaneous, independent data access operations for different memory planes in the plurality of memory planes,
wherein the simultaneous, independent data access operations comprise a first operation executed in burst mode and a second operation executed in random access mode.

13. The method of claim 12, wherein the simultaneous, independent data access operations comprise a read operation and a write operation.

14. The method of claim 12, wherein cell array blocks corresponding to different memory planes use different input/output (I/O) terminals.

15. The method of claim 12, wherein cell array blocks corresponding to different memory planes use a common set of input/output (I/O) terminals by alternately driving the I/O terminals.

16. The method of claim 15, wherein the I/O terminals are alternately driven by synchronizing data access operations corresponding to different memory planes to different clocks.

17. The device of claim 15, wherein the I/O terminals are alternately driven by synchronizing data access operations corresponding to different memory planes to different states of a single clock.

18. The method of claim 12, wherein each memory plane is determined to have at least one cell array block by a column decoder and a corresponding bus.

19. A method of operating a semiconductor memory device having a memory cell array comprised of a plurality of cell array blocks, the method comprising:
operationally dividing the memory cell array into a plurality of memory planes, each memory plane having at least one cell array block and an independent operating mode; and
performing simultaneous, independent data access operations for different memory planes in the plurality of memory planes,
wherein operationally dividing the memory cell array into a plurality of memory planes comprises:
generating memory plane definition data and a bus switching control signal using a plane definition logic unit in response to a plane definition command, wherein the bus switching control signal controls switches in a data bus transferring data between the cell array blocks and respective input/output (I/O) terminals.

20. The method of claim 19, further comprising:
selecting cell array blocks pertaining to a particular memory plane by receiving the memory plane definition data and a control signal output by a control buffer, and decoding the memory plane definition data;
wherein the control signal indicates an operating mode.

21. The method of claim 20, wherein the memory plane definition data is decoded by a plurality of block selectors arranged according to the number of memory planes in the plurality of memory planes; and,
wherein the cell array blocks pertaining to a particular memory plane are selected by selectively controlling switches within a block selection path.

22. The method of claim 20, wherein a burst mode operation for respective memory planes is controlled by a burst counter which counts the duration of the burst operation.

23. The method of claim 20, wherein the memory cell array is divided into first and second memory planes and cell array blocks pertaining to different memory planes use separate input/output (I/O) terminals;
wherein where a burst mode start cycle is executed in the first memory plane, an I/O terminal connected to the second memory plane has a high impedance state or is maintained in the same state as in an immediately previous cycle; and,
in a cycle where a burst continuation operation is executed in the first memory plane, a random access operation is performed in another memory plane and data is output through the I/O terminal connected to the second memory plane.

24. The method of claim 20, wherein the memory cell array is divided into first and second memory planes and cell array blocks pertaining to respective memory planes are connected through a common input/output (I/O) terminal;
wherein where a burst mode start cycle is executed in the first memory plane, an I/O terminal connected to the second memory plane has a high impedance state or is maintained in the same state as in an immediately previous cycle; and,
in a cycle where a burst continuation operation is executed in the first memory plane, a random access operation is executed in the second memory plane, and data from the first and second memory planes is alternately output through the I/O terminal.

25. A method of operating a semiconductor memory device having a memory cell array comprised of a plurality of cell array blocks, the method comprising:
operationally dividing the memory cell array into a plurality of memory planes, each memory plane having at least one cell array block and an independent operating mode; and,
performing simultaneous, independent data access operations for different memory planes in the plurality of memory planes,
wherein the simultaneous, independent data access operations comprise a first operation executed in burst mode and a second operation executed in burst mode.

26. The method of claim 25, wherein the simultaneous, independent data access operations comprise a read operation and a write operation.

27. The method of claim 25, wherein cell array blocks corresponding to different memory planes use different input/output (I/O) terminals.

28. The method of claim 25, wherein cell array blocks corresponding to different memory planes use a common set of input/output (I/O) terminals by alternately driving the I/O terminals.

29. The method of claim 28, wherein the I/O terminals are alternately driven by synchronizing data access operations corresponding to different memory planes to different clocks.

30. The device of claim 28, wherein the I/O terminals are alternately driven by synchronizing data access operations corresponding to different memory planes to different states of a single clock.

31. The method of claim 25, wherein each memory plane is determined to have at least one cell array block by a column decoder and a corresponding bus.

* * * * *